United States Patent

Bruder et al.

[11] Patent Number: 5,087,880
[45] Date of Patent: Feb. 11, 1992

[54] METHOD FOR SENSING NUCLEAR MAGNETIC RESONANCE SIGNALS GIVEN ARBITRARY GRADIENT SHAPES

[75] Inventors: Herbert Bruder, Hemhofen; Hubertus Fischer; Hans-Erich Reinfelder, both of Erlangen; Franz Schmitt, Baiersdorf, all of Fed. Rep. of Germany

[73] Assignee: Siemens Aktiengesellschaft, Munich, Fed. Rep. of Germany

[21] Appl. No.: 482,963

[22] Filed: Feb. 22, 1990

[30] Foreign Application Priority Data

Feb. 24, 1989 [EP] European Pat. Off. ......... 89103292.2

[51] Int. Cl.$^5$ ............................................. G01R 33/20
[52] U.S. Cl. ..................................................... 324/309
[58] Field of Search ............... 324/300, 307, 309, 312, 324/314

[56] References Cited

U.S. PATENT DOCUMENTS 4,703,271 10/1987 Loeffler et al. ...................... 324/314
4,748,411 5/1988 Holland ................................. 324/312
4,891,595 1/1990 Granot ................................. 324/309

FOREIGN PATENT DOCUMENTS 0076054 4/1986 European Pat. Off. .

Primary Examiner—Michael J. Tokar
Attorney, Agent, or Firm—Hill, Van Santen, Steadman & Simpson

[57] ABSTRACT

A method for operating a nuclear resonance imaging device given gradients of arbitrary shapes includes the steps of equidistantly sampling the nuclear magnetic resonance signals in the time domain with a sampling rate that satisfies the sampling theorem, the sampling taking place even given gradients having a non-rectangular pulse shape. Since non-equidistant sampling in the K-space would normally lead to image artifacts, the method includes the further step, to avoid such artifacts, of calculating measured values from the acquired samples by interpolation, these measured values being equidistant in the K-space, and being entered into a measurement matrix. The equidistant sampling in the K-space, which is complicated, is thus superfluous given gradients having an arbitrary pulse shape.

6 Claims, 5 Drawing Sheets

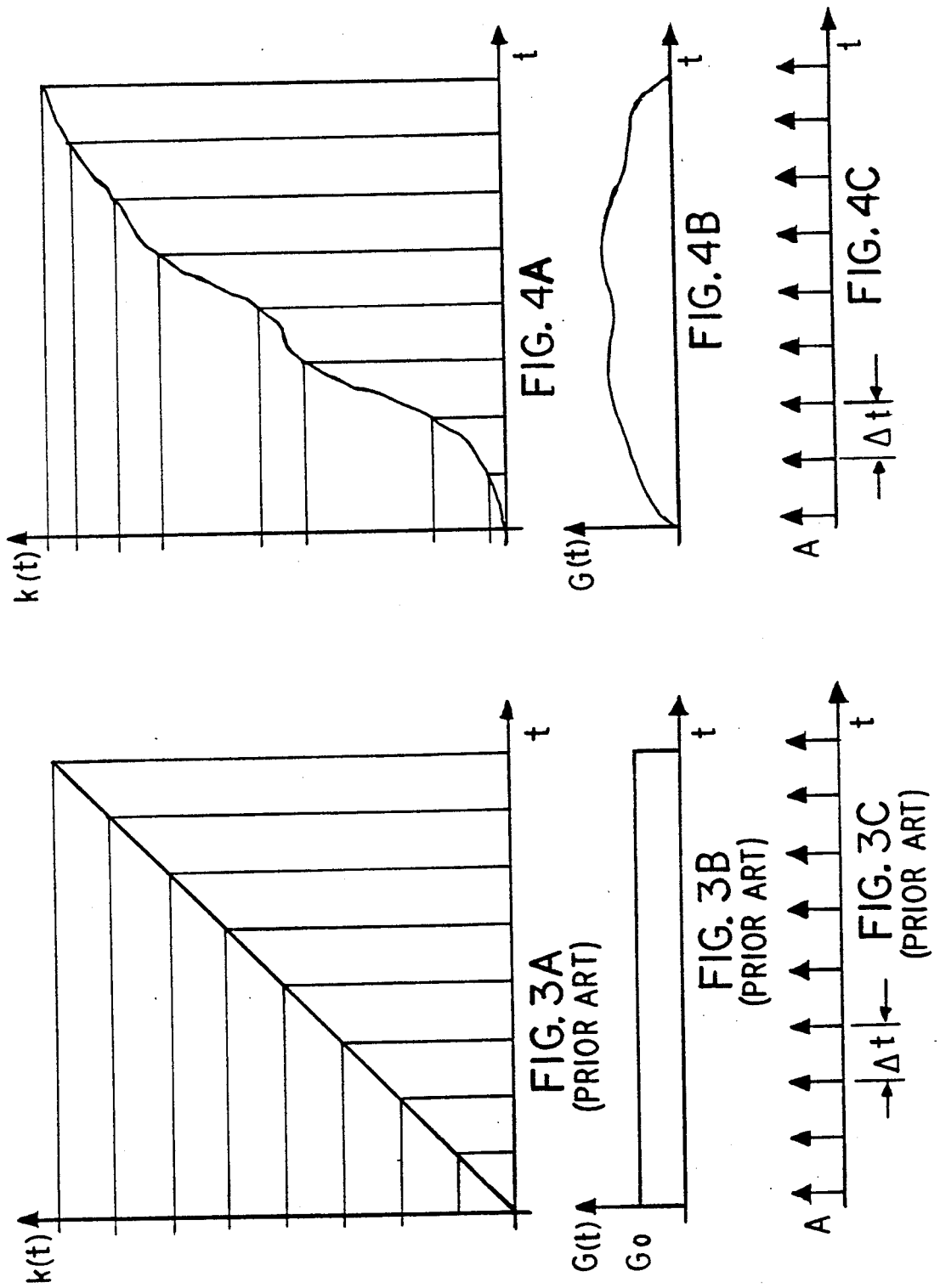

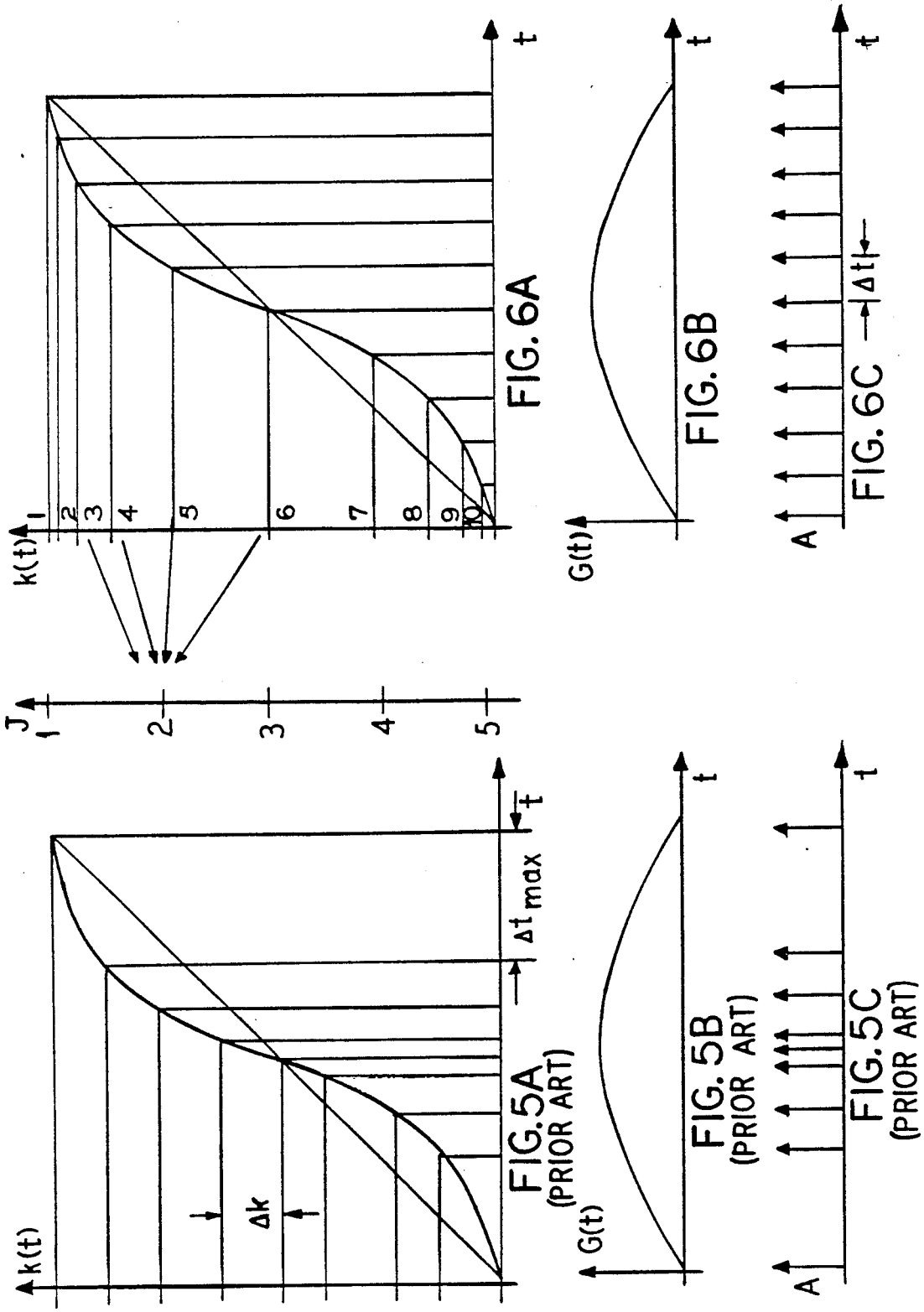

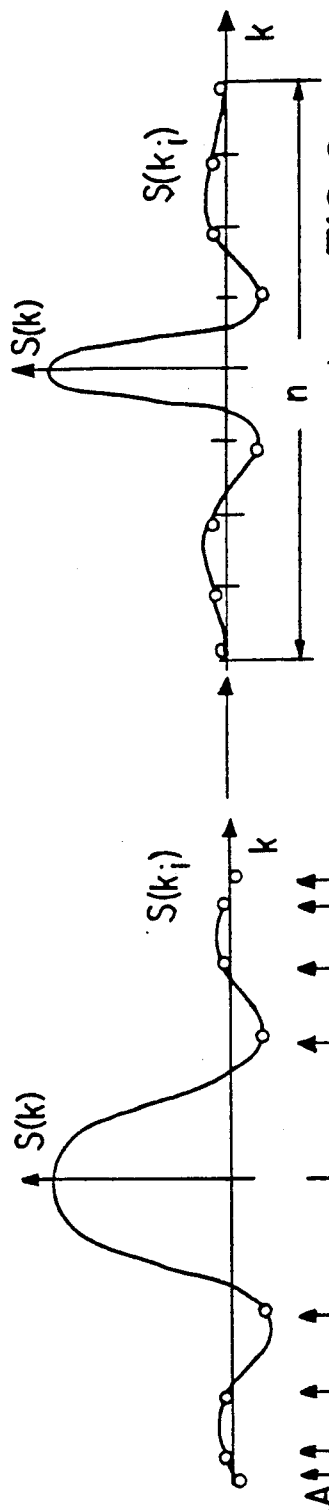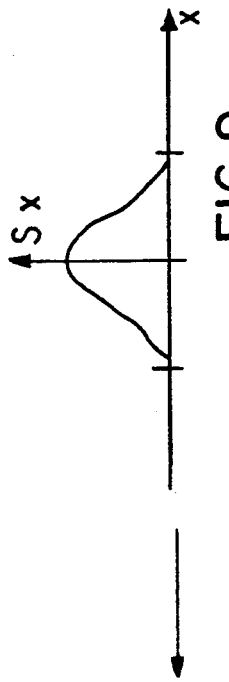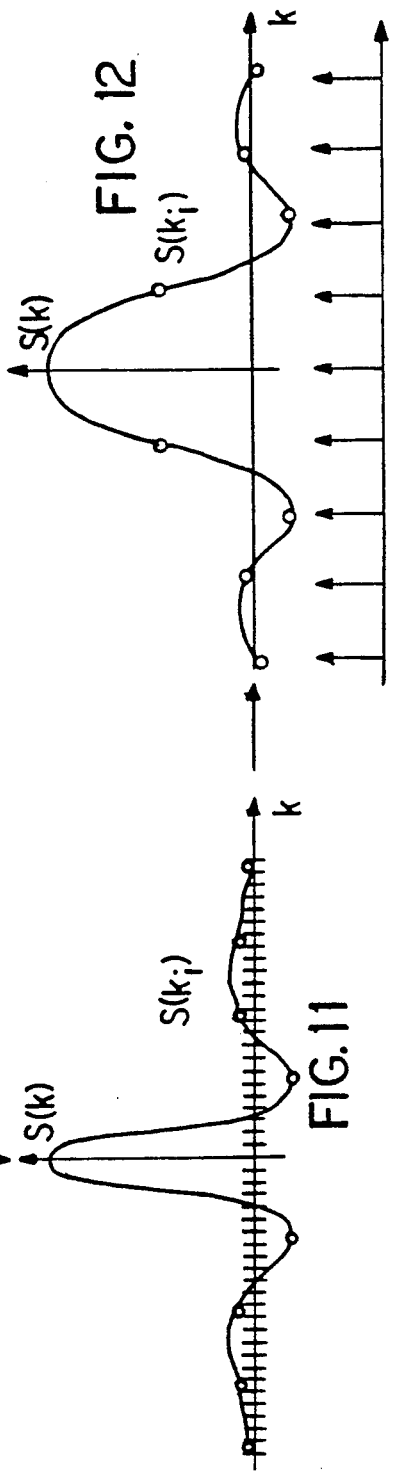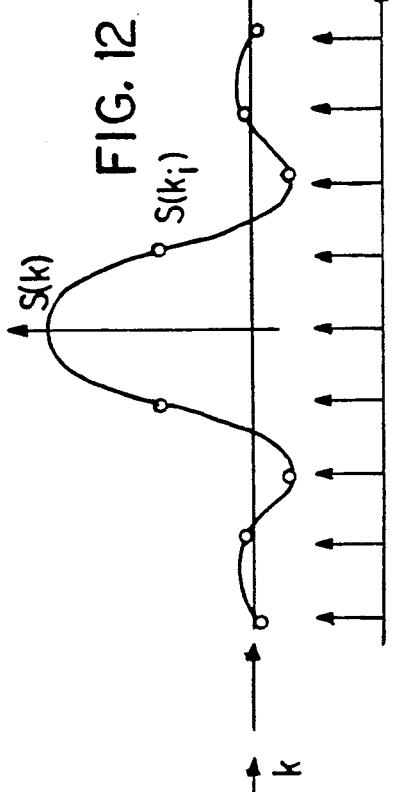

METHOD FOR SENSING NUCLEAR MAGNETIC RESONANCE SIGNALS GIVEN ARBITRARY GRADIENT SHAPES

BACKGROUND OF THE INVENTION

1. Field of the Invention

The present invention relates to a method for sensing nuclear magnetic resonance signals, and in particular to such a method which can be used with gradient signals having an arbitrary shape.

2. Description of the Prior Art

Magnetic resonance imaging devices, and methods for operating such devices, are known wherein one or more regions of an examination subject are excited with RF pulses and the resulting nuclear magnetic resonance signals are phase-coded and/or frequency coded dependent on the point of origin by switched magnetic field gradients having a rectangular pulse shape. The nuclear magnetic resonance signals are sensed in the time domain, and the samples acquired in this manner are entered into a measurement matrix in the K-space as measured values. The measurement matrix is then subjected to a Fourier transformation for imaging.

As noted above, in conventional magnetic resonance imaging systems and methods for operating those systems, magnetic field gradients having a rectangular pulse shape are usually employed or, if the gradient field pulse shape was non-rectangular, only that region of the gradient pulses in which the gradient has a constant value were used, for reading out the nuclear magnetic resonance signals. Given fast pulse sequences as are necessary, for example, in the echo planar method, it is extremely difficult to generate rectangular gradient pulses with sufficient amplitude. If the read out interval is limited to the region of the gradient pulse having a constant gradient value, much of the pulse is unusable, thereby wasting read out time.

A magnetic resonance imaging method making use of the aforementioned echo planar sequences is described in European application 0 076 054, wherein sinusoidal gradients are used. To avoid image distortions, sensing of the measured signals does not take place equidistantly in the time domain, but instead takes place equidistantly in the K-space. The chronologically non-equidistant sensing required in this method is difficult to achieve, and cannot be accomplished in standard nuclear magnetic resonance imaging devices.

SUMMARY OF THE INVENTION

It is an object of the present invention to provide a method for sensing magnetic resonance signals for the purpose of generating an image which can be used with gradients of arbitrary shapes.

The above object is achieved in a method wherein the magnetic resonance signal is equidistantly sampled in the time domain with a sampling rate that satisfies the sampling theorem, and wherein measured values are acquired by interpolation from the samples, these measured values being equidistant in the K-space and being entered into a measurement matrix. This permits arbitrary gradient shapes to be sensed chronologically equidistantly, without causing artifacts.

DESCRIPTION OF THE DRAWINGS

FIGS. 3A-3C is a prior art showing of graphs showing how equidistant sampling in the K-space occurs using the pulse sequence of FIGS. 2a-2E.

FIGS. 4a-4C show a gradient pulse of arbitrary shape.

FIGS. 5A-5C show how the method of prior art European application 0 046 782 operates on a sinusoidal gradient pulse.

FIGS. 6A-6C show how an embodiment of the method in accordance with the principles of the present invention operates on a sinusoidal gradient pulse.

FIGS. 7-12 illustrate a further embodiment of the method in accordance with the principles of the present invention.

DESCRIPTION OF THE PREFERRED EMBODIMENTS

Figure 1:
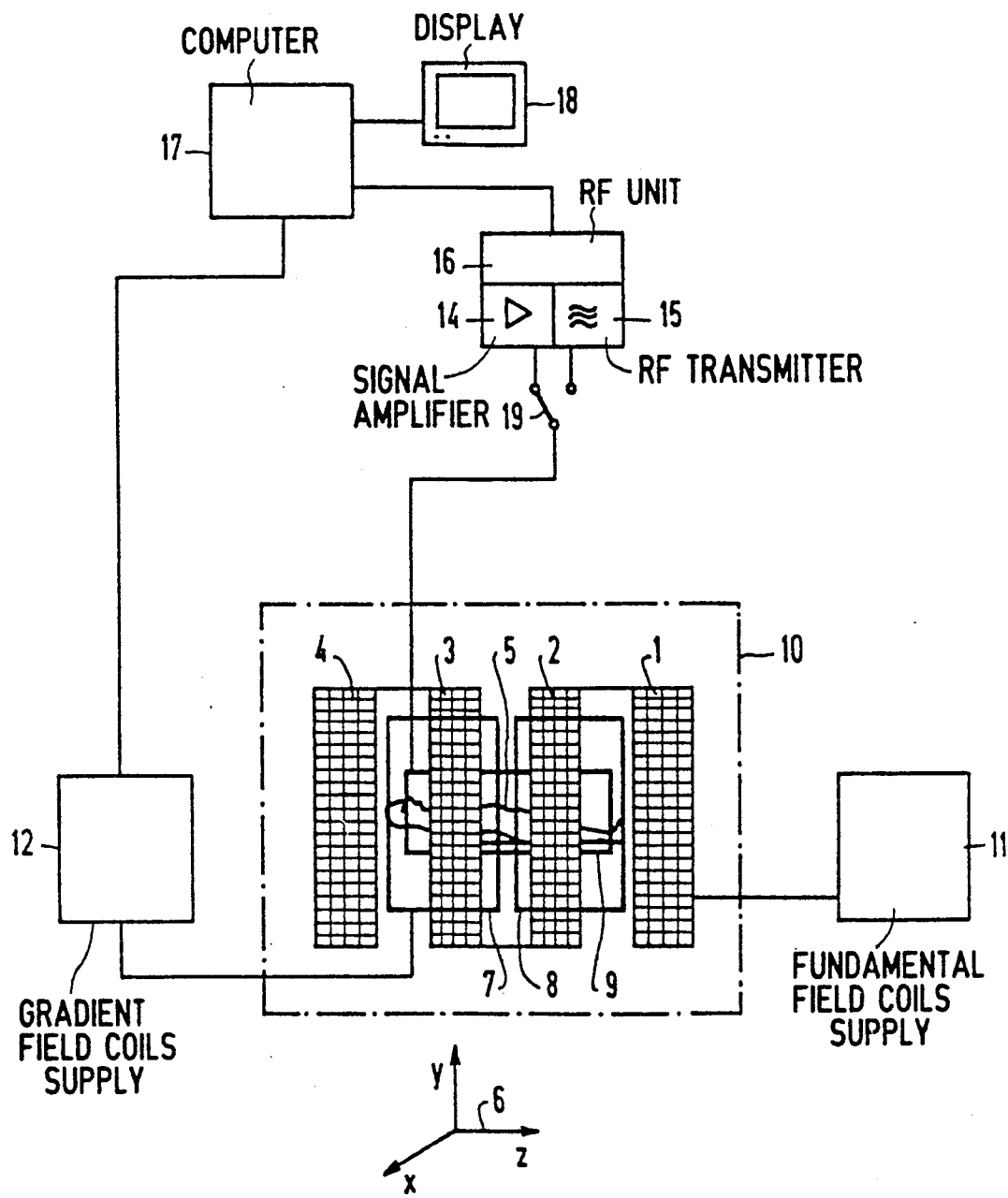
FIG. 1 is a block diagram of a magnetic resonance imaging device which can be operated using the method in accordance with the principles of the present invention.
Figure 2A:
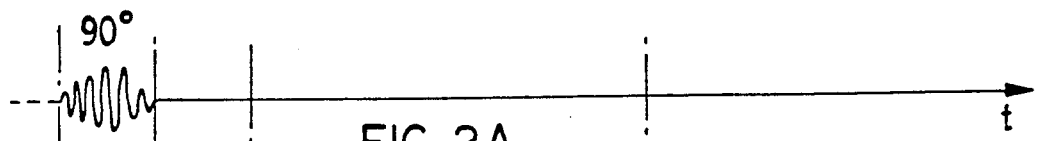
FIGS. 2A -2E is a prior art showing of graphs of pulse sequences for operating the apparatus of FIG. 1 in accordance with European application 0 046 782.
Figure 2B:
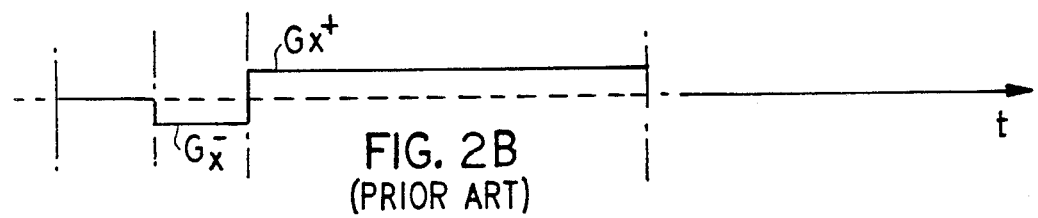
Figure 2C:
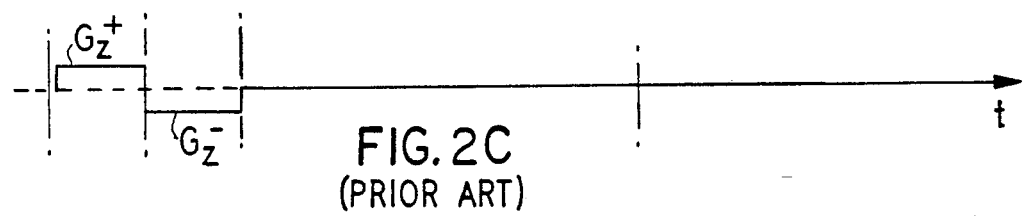
Figure 2D:
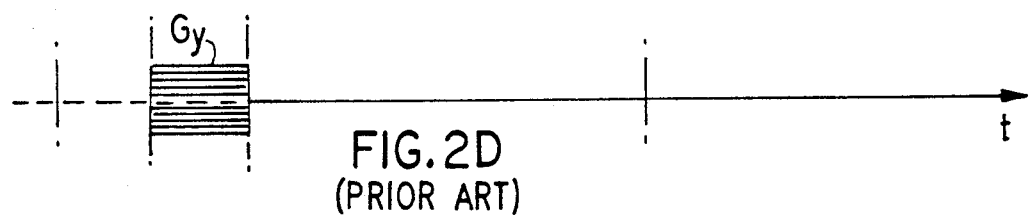
Figure 2E:
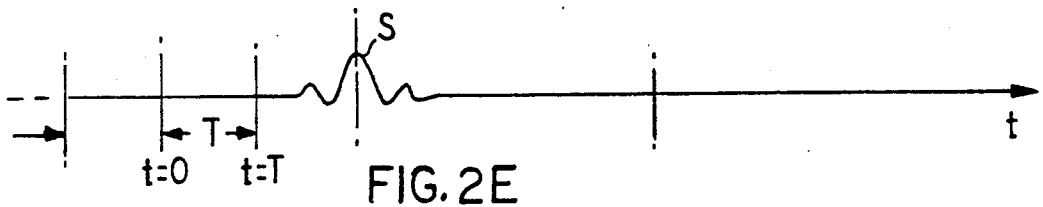

A conventional magnetic resonance imaging apparatus is shown in FIG. 1 for explaining the method disclosed herein. The system includes fundamental magnetic field coils 1, 2, 3 and 4 which generate a fundamental magnetic field in which an examination subject 5 is disposed. Gradient coils are also provided for respectively generating independent magnetic field components perpendicular to each other oriented in the x, y and z directions, as indicated by the coordinate axes 6. For clarity, only the gradient coils 7 and 8 are shown in FIG. 1, which generate the x-gradient in combination with a pair of identical gradient coils (not shown) disposed on the opposite side of the patient. Sets of y-gradient coils (not shown) are disposed parallel to, above and below, the examination subject 5. Sets of z-gradient coils (not shown) are disposed at the head and at the feet of the examination subject 5, extending transversely relative to a longitudinal axis of the patient.

A radio frequency coil 9 is provided which causes nuclear magnetic resonance signals to be generated in the examination subject 5, when supplied with a radio frequency pulse, and which is also used to acquire the nuclear magnetic resonance signals. The coils 1, 2, 3, 4, 7, 8 and 9, bounded by a dot-dash line 10, represent the actual examination instrument.

The examination instrument 10 is operated by electrical components which include a power supply 11 for the fundamental field coils and a power supply 12 for the gradient coils. The radio frequency coil 9 is coupled to a computer 17 via a signal amplifier 14, for receiving the nuclear magnetic resonance signals, or via a transmitter 15 for generating the nuclear magnetic resonance signals. The amplifier 14 and the transmitter 15 in combination form an RF unit 16. The coil 9 is connected either to the amplifier 14 or the transmitter 15 via a switch 19. The computer 17, which is also connected to the gradient field coils supply 12, constructs an image of a region of the examination subject 5 based on the acquired signals, and the image is reproduced on a display 18.

Many types of pulse sequences are known for operating the RF unit 16 and the gradient coils. The most common methods are those wherein imaging is based on a two-dimensional or three-dimensional Fourier transformation.

Image acquisition using two-dimensional Fourier transformation will be described below with reference to a simple pulse sequence as shown in FIG. 2. This method corresponds to the method disclosed in European application 0 046 782, which contains a more detailed explanation of the method.

Given the pulse sequence of FIG. 2, the examination subject is subjected to a 90° RF pulse which is slice-selective by means of the simultaneous generation of a gradient pulse $G_z^+$ in the z-direction. A subsequent oppositely directed z-gradient pulse $G_z^-$ is generated, which cancels the dephasing produced by the first pulse $G_z^+$. Simultaneously, a negative gradient pulse $G_z^-$ is generated which dephases the nuclear spins in the x-direction, and a phase coding gradient $G_y$ is also generated which impresses a phase response on the nuclear spins dependent on their y-position. Subsequently, a positive gradient $G_x^+$ is generated which again rephases the nuclear spins in the x-direction. A signal S is read out during the gradient pulse $G_x^+$. The signal S is measured as a complex quantity by phase-sensitive demodulation, which produces an analog signal. This analog signal is sampled in a time grid, and the samples are digitized and entered into a row of a measurement matrix.

The pulse sequence shown in FIG. 2 is executed n times, with the amplitude of the gradient pulse $G_y$ being varied in equidistant steps from pulse sequence to pulse sequence. The digital signals acquired after demodulation and sensing are each again entered into a row of the measuring matrix, so that a measuring matrix having n rows is ultimately obtained. The measurement matrix can be considered as a measured data space, i.e., a measured data plane in the two-dimensional case, in which the signal values are measured on a equidistant point network. In nuclear magnetic resonance tomography, this measured data space is generally referred to the K-space.

Information about the spatial origins of the signal contributions is needed for generating the image, and this information is coded in the phase factors of the stored signals. The relationship between the locus space (i.e., the image) and the K-space exists mathematically via a two-dimensional Fourier transformation:

$$s(k_x, k_y) = \int\int \zeta(x,y) e^{i(k_x x + k_y y)} dx dy$$

wherein $$k_x(t) = \gamma \int_0^t G_x(t') dt' \quad (2)$$

$$k_y(t) = \gamma \int_0^t G_y(t') dt' \quad (3)$$

and wherein $\zeta(x,y)$ is the spin density distribution taking relaxation times into consideration.

The following relationships are valid in simplified form for the case of rectangular gradients as shown in FIG. 2:

$$k_x(t) = \gamma G_x \cdot t \quad (4)$$

$$k_y(t) = \gamma G_y \cdot T \quad (5)$$

wherein $\gamma$ is the gyromagnetic ratio, T is the total duration of the phase coding gradient $G_y$, and i is the phase coding step.

In this case, the sensing of the magnetic resonance signal, for example, the triggering of the analog-to-digital converter which converts the signal into digital values, can be executed equidistantly in time. FIG. 3 shows that, given a constant gradient G(t), a measured value trigger at a constant spacing Δt also leads to an equidistant sampling in the K-space, i.e., to the function k(t). The measured data acquired in this manner can be directly reconstructed to form the image with the aforementioned Fourier transformation.

If, however, the magnetic resonance signals are read out using a gradient pulse having an arbitrary shape, instead of a constant gradient pulse shape, this leads to distortions in the K-space. This is illustrated in FIG. 4 which shows the function k(t) which results for a non-constant gradient G(t) as a consequence of equations (2) and (3) above. If a chronologically equidistant sampling of the measured value, as indicated in FIG. 4 by the arrows, is undertaken, the illustrated distortions in the K-space result. When the data acquired in this fashion are subjected to a Fourier transformation, intolerable image artifacts occur.

One solution to this problem was proposed in the aforementioned European application 0 076 054, which undertakes a measured value sampling which is not equidistant in the time domain, but is equidistant in the K-space. This known method is shown in FIG. 5. A sinusoidal readout gradient G(t) is assumed in this example. This results in the curve of the function k(t) which is also shown in FIG. 5. The times for the measured value sampling are then selected so that equidistance in the K-space results. The maximum spacing of successive temporal sampling points $\Delta t_{max} = t_{i+1} - t_i$ must be selected such that the resulting K-space increment $\Delta K$ is less than or equal to the reciprocal of the image size $\Delta x$. This is mathematically expressed as follows:

$$\delta k = \gamma \int_{t_i}^{t_{i+1}} G(t) dt \leq \Delta x^{-1} \quad (6)$$

This is a condition which the sampling theorem requires in order to avoid an "under-sampling" of the K-space, which would cause fold-backs in the image.

The method for non-equidistant sampling in the time space was also suggested for sinusoidal and cosinusoidal gradient pulses in the aforementioned European application 0 076 054. The method of the present invention described in the example below is suitable for any arbitrary gradient pulse shape.

In contrast to the above-discussed known methods, in the method of the invention an equidistant sampling of the magnetic resonance signals in the time domain ensues given a arbitrary gradient pulse shape. The chronological spacing Δt between successive sampling points must satisfy the aforementioned equation (6) so that the sampling theorem is not violated.

The equidistance in the K-space needed to avoid any artifacts is achieved in the inventive method by interpolation of the measured data. The interpolation results in no significant image errors, because the sampling theorem is not violated, i.e., there is no under-sampling. In a first embodiment, the interpolation is undertaken directly, for example with cubic splines on an equidistant K-space grid.

This method is illustrated in FIG. 6. A sinusoidal gradient G(t) is again assumed. The chronological course of the function k(t) is also shown in FIG. 6. Sampling ensures at constant chronological intervals Δt. A non-equidistant sampling in the K-space would thus be obtained.

The corresponding sample points which yield a measured grid in the K-space are referenced 1 through 10 in FIG. 6 on the K-axis. The direct further processing of these sample points, as described above, would in conventional methods lead to artifacts in the image. In the present method, however, an equidistant interpolation grid J is now defined in the K-space, with the measured values to be processed being acquired in this interpolation grid by interpolation of the values present in the measured grid. For example, this interpolation can be undertaken with cubic splines. In this case, for example, the points 3 through 6 of the measured grid contribute to the definition of the point 2 of the interpolation grid J, which is equidistant in the K-space. The contribution of each point is confined by the cubic spline functions. The measured values defined in the interpolation grid J are then entered into the measuring matrix.

Other functions, for example the sinc function, can also employed for the interpolation. These represent the sampling theorem most ideally. The disadvantage of direct sinc interpolation, however, is that only a finite number of neighboring samples can be used.

The aforementioned interpolation may be referred to as "direct interpolation." An embodiment of the method making use of "indirect interpolation" is set forth below with reference to FIGS. 7 through 12. In this embodiment, a measured value sampling equidistant in the time domain is again initially undertaken. This again results in a non-equidistant measured value sampling of the continuous signal S(k) with respect to the K-space (indicated by arrows in FIG. 7). A sampled magnetic resonance signal $S(k_i)$ having N supporting points is thus obtained in a data field, as shown in FIG. 8. The inherently non-equidistant K-values are equidistantly arranged in the data field. This sampled magnetic resonance signal is subjected to a Fourier transformation as shown in FIG. 9, and is subsequently centrally inserted in a larger data field (previously set to zero) having $N' = N \times M$ supporting points, as indicated in FIG. 10. The number N' of supporting points should be a power of two in order to utilize fast Fourier transformation.

A data field having N' supporting points is thus now obtained in which the signal S(x) is centrally disposed and the remaining supporting points are occupied by zeros. This data field is then subjected to an inverse Fourier transformation.

The result is shown in FIG. 11, wherein the original, sensed magnetic resonance signal is now obtained, however with M supporting points between successive ones of the N original supporting points. The M supporting points correspond to a sinc interpolation.

The magnetic resonance signal calculated in this manner still corresponds to a non-equidistantly sampled K-space signal. The equidistance in the K-space is now achieved because only those of the N' supporting points $K_i$ are used as samples of the measured signal which lie closest to the sample on an equidistant K-space grid. The supporting points $K_i'$ which correspond to an equidistantly sampled K-space are now obtained from the inverse function of K(t), which is referred to as $K^{-1}(t)$.

If, for example, $k = \gamma G \sin(\omega t)$, then $k^{-1}(t)$ is calculated according to the following equation:

$$K^{-1}(t) = t = (1/\omega)\arcsin(k(t)/\gamma G).$$

The precision of this interpolation is greatly dependent on the number M. The interpolation becomes more precise as M increases. Because processors for a fast Fourier transformation are available, the indirect type of interpolation has the advantage of being rapidly executed.

The function S(k) is shown in FIG. 12 having sampling points $k'_i$ equidistant in the K-space which are identified according to the method described herein. For the purpose of illustration, the function S(k) is shown in the physical K-space, rather than in the data field.

As noted above, a need for the aforementioned method of acquiring measured values given non-constant gradients particularly occurs in imaging according to the echo planar method. Non-constant gradients, and thus the method disclosed herein, can also be used to advantage in other methods.

Although modifications and changes may be suggested by those skilled in the art, it is intention of the inventors to embody within the patent warranted hereon all changes and modifications as reasonably and properly come within the scope of their contribution to the art.

We claim as our invention:

1. A method for obtaining a magnetic resonance image comprising the steps of:
   generating a fundamental magnetic field;
   subjecting an examination subject in said fundamental magnetic field to radio frequency pulses to generate nuclear magnetic resonance signals in a region of said examination subject;
   subjecting said examination subject to a plurality of switched magnetic field gradients of arbitrary pulse shape to code said nuclear magnetic resonance signals;
   acquiring the coded nuclear magnetic resonance signals;
   equidistantly chronologically sampling the acquired coded nuclear magnetic resonance signals at a sampling rate which satisfies the sampling theorem, thereby obtaining samples;
   interpolating the samples to obtain measured values which are equidistant in K-space;
   entering said measured values in a measurement matrix in a memory;
   constructing an image of said region of said examination subject from said measurement matrix in said memory; and
   displaying said image.

2. A method as claimed in claim 1, wherein the step of interpolating the samples is further defined by directly interpolating said samples to obtain measured values which are equidistant in the K-space.

3. A method as claimed in claim 2, wherein the step of interpolating is further defined by interpolating the samples using cubic splines to obtain measured values which are equidistant in the K-space.

4. A method as claimed in claim 2, wherein the step of interpolating is further defined by interpolating the samples using sinc functions to obtain measured values which are equidistant in the K-space.

5. A method as claimed in claim 1, wherein the samples obtained in the step of equidistantly sampling the acquired coded nuclear magnetic resonance signals in the time domain have N supporting points, and comprising the additional steps of:
  subjecting said samples to a Fourier transformation;
  setting a data field having $N \times M$ supporting points to zero, where M is a selected number greater than N;
  centrally entering the samples subjected to the Fourier transformation in said data field;
  subjecting said data field to an inverse Fourier transformation; and
  using only those sample points in said data field which are closest to sample points in an equidistant K-space grid for constructing said image.

6. A method as claimed in claim 5, comprising the additional step of:
  calculating the sample points in said equidistant K-space grid by interpolation from said data field.

* * * * *